(12) United States Patent
Lee et al.

(10) Patent No.: US 6,928,008 B2
(45) Date of Patent: Aug. 9, 2005

(54) SEMICONDUCTOR MEMORY DEVICES WITH DATA LINE REDUNDANCY SCHEMES AND METHOD THEREFORE

(75) Inventors: Hi-Choon Lee, Yongin-shi (KR); Kwang-Hyun Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 31 days.

(21) Appl. No.: 10/358,205

(22) Filed: Feb. 5, 2003

(65) Prior Publication Data

US 2004/0032766 A1 Feb. 19, 2004

(30) Foreign Application Priority Data

Feb. 5, 2002 (KR) .......................................... 2002-6437

(51) Int. Cl.[7] ................................................. G11C 7/00
(52) U.S. Cl. ................ 365/200; 365/233.5; 365/230.06
(58) Field of Search .............................. 365/200, 225.7, 365/230.06, 230.08, 233.5

(56) References Cited

U.S. PATENT DOCUMENTS

| | | | | |
|---|---|---|---|---|
| 5,305,284 A | * | 4/1994 | Iwase ...................... | 365/238.5 |
| 5,373,471 A | * | 12/1994 | Saeki et al. .................. | 365/200 |
| 5,452,252 A | * | 9/1995 | Wada et al. ................. | 365/200 |
| 6,567,310 B2 | * | 5/2003 | Einaga et al. ............ | 365/185.2 |
| 2004/0004866 A1 | * | 1/2004 | Hidaka ........................ | 365/200 |

FOREIGN PATENT DOCUMENTS

KR  10-0135680  1/1998

* cited by examiner

*Primary Examiner*—Gene N. Auduong
(74) *Attorney, Agent, or Firm*—Harness, Dickey & Pierce, P.L.C.

(57) ABSTRACT

The semiconductor memory device includes an address change circuit, which is programmable to change a column address, and a column selection circuit, which generates first and second column selection signals addressing columns in first and second portions of a memory array based on the received column address from the address change circuit. When at least one column addressed by the column address in both of the first and second portions of the memory array includes a defective cell, the address change circuit can be programmed to change the address so that defective cells are not addressed.

10 Claims, 18 Drawing Sheets

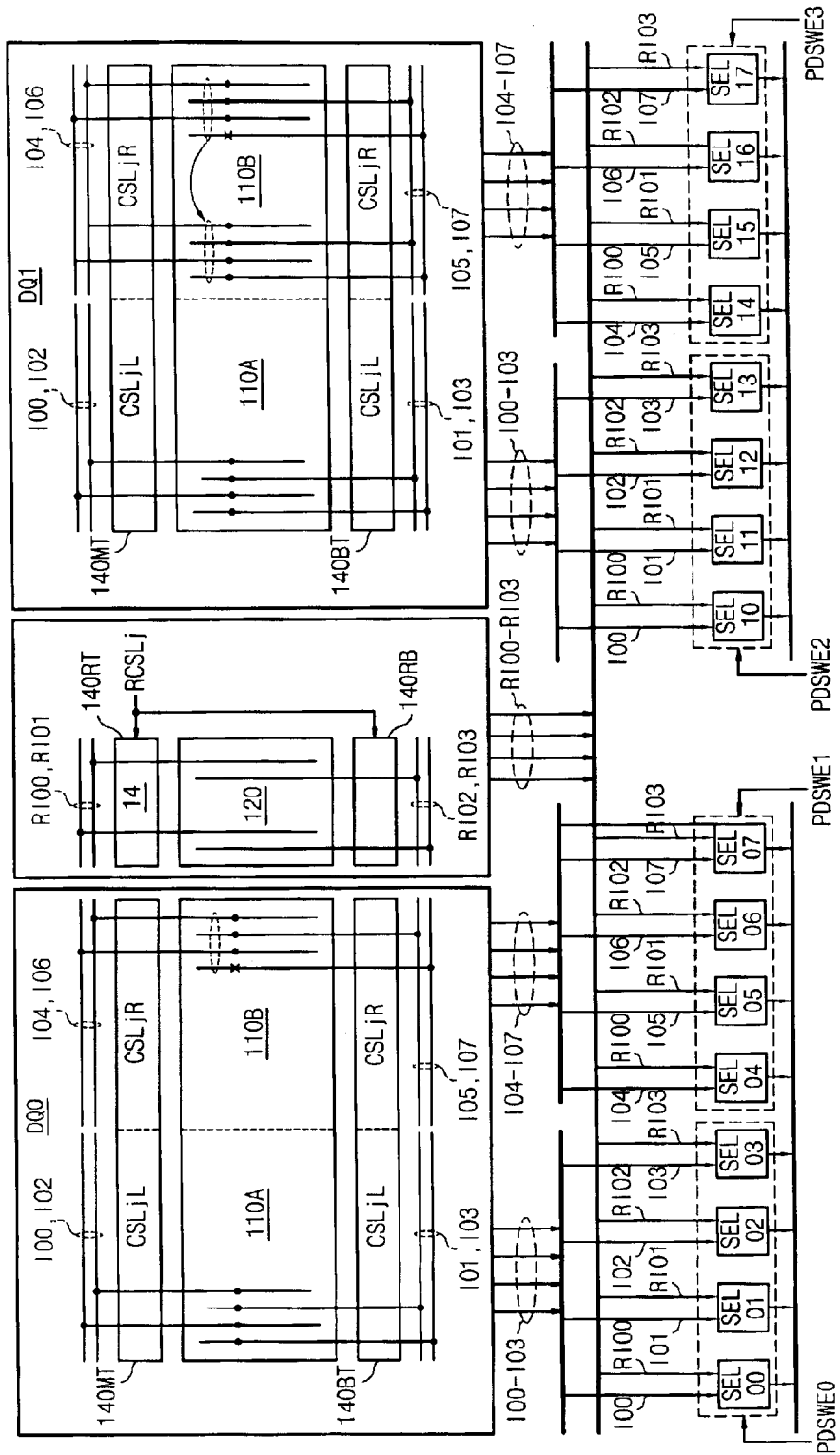

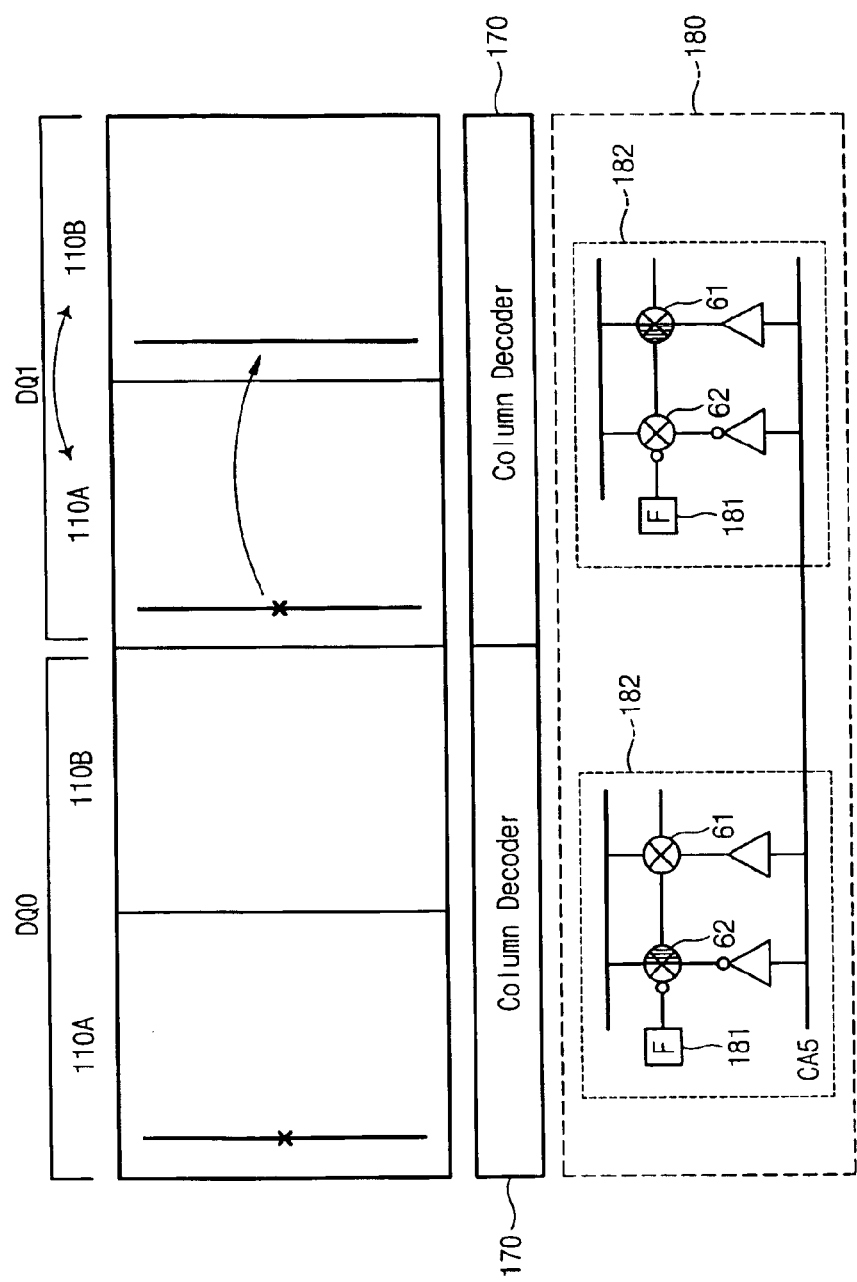

SEMICONDUCTOR MEMORY DEVICES WITH DATA LINE REDUNDANCY SCHEMES AND METHOD THEREFORE

RELATED APPLICATION

This application relies for priority upon Korean Patent Application No. 2002-06437, filed on Feb. 5, 2002, the contents of which are herein incorporated by reference in their entirety.

FIELD OF THE INVENTION

The present invention relates to semiconductor integrated circuit devices, and more particularly to semiconductor memory devices adopting data line redundancy schemes.

BACKGROUND OF THE INVENTION

Semiconductor memory devices including dynamic random access memory (DRAM) devices adopt a redundancy technique, which may replace defective memory cells with redundant memory cells so as to improve the yield. The redundancy techniques may be divided into two types, row redundancy and column redundancy, both of or one of which can be applied to semiconductor memory devices.

These redundancy techniques are known to those skilled in the art and at least one of these techniques is disclosed in Korean Patent Publication No. 1999-061991 entitled "Semiconductor Device Having A Plurality of Redundancy Input/Output Lines," Korean Patent Publication No. 1998-040822 entitled "Semiconductor Memory Device Having Row Defect Repairing Circuit," Korean Patent Publication No. 1999-073672 entitled "Column Redundancy Circuit for Use in Semiconductor Memory Devices," U.S. Pat. No. 5,892,719 entitled "Redundancy Circuit Technique Applied DRAM of Multi-bit I/O Having Overlaid-DQ Bus," U.S. Pat. No. 5,812,466 entitled "Column Redundancy Circuit for A Semiconductor Memory Device," and U.S. Pat. No. 5,761,138 entitled "Memory Devices Having A Flexible Redundant Block Architecture."

FIG. 1 is a diagram illustrating an input/output line scheme in which when one column selection line is activated, and 8-bit data is read out from one memory block. Referring to FIG. 1, a memory block BLK comprises memory cells (denoted by "●" in the memory block) which are arranged in a matrix of rows (or word lines) and columns (or bit lines). Some of the columns of the memory block are selectively coupled to input/output lines IO0–IO3 via a sense amplification and input/output block 12, which is disposed at a top of the memory block. The rest of the columns are selectively coupled to input/output lines IO4–IO7 via a sense amplification and input/output block 13, which is disposed at a bottom of the memory block BLK. Although not shown in the drawings, each of the sense amplification and input/output blocks 12 and 13 includes a latch-type sense amplifier circuit and an input/output gate circuit as is known to those skilled in the art.

In the input/output line scheme as illustrated in FIG. 1, the input/output gate circuits of the sense amplification and input/output blocks 12 and 13 are controlled in common by one column selection signal CSLj. That is, when one column selection signal CSLj is activated according to column address information, 8 columns are respectively connected to input/output lines IO0–IO7 via the sense amplification and input/output blocks 12 and 13. Consequently, when one column selection signal is activated, 8-bit data is read out from the memory block BLK or written into the memory block BLK. When a column address is inputted, one column selection line CSLj is activated.

However, as the memory blocks increase in number, the input/output line scheme of FIG. 1 becomes inadequate for laying out the input/output lines. That is, because corresponding input/output lines are disposed in each memory block and are embodied using metal, it becomes very difficult to dispose enough input/output lines in a space between adjacent memory blocks.

To solve the foregoing problem, an input/output line scheme as illustrated in FIG. 2 has been proposed. Referring to FIG. 2, four input/output lines IO0, IO2, IO4, and IO6 are disposed at a top of the memory block BLK, and four input/output lines IO1, IO3, IO5, and IO7 are disposed at a bottom of the memory block BLK. Two input/output lines IO0 and IO2 of the input/output lines IO0, IO2, IO4, and IO6 that are disposed at the top are formed at the same layer as other input/output lines IO4 and IO6. Two input/output lines IO1 and IO3 of the input/output lines IO1, IO3, IO5, and IO7 that are disposed at the bottom are formed at the same layer as other input/output lines IO5 and IO7. In the input/output line scheme, the sense amplification and input/output blocks 12 and 13, which are disposed at the top and bottom, respectively, are controlled by corresponding column selection is signals CSLjR and CSLjL, respectively. For example, when the column selection signal CSLjL is activated, the input/output lines IO0–IO3 are respectively connected to corresponding columns. Also, when the column selection signal CSLjR is activated, the input/output lines IO4–IO7 are respectively connected to corresponding columns. Here, the column selection signals CSLjR and CSLjL are activated by the identical column address information. That is, when a column address is inputted, two column selection lines CSLjR and CSLjL are simultaneously activated. However, when a defective column is replaced in a semiconductor memory device adopting the input/output line scheme of FIG. 2, there arises a problem, which will be described in detail hereinafter.

FIG. 3 is a block diagram of a conventional semiconductor memory device. As illustrated in FIG. 3, an input/output line scheme of FIG. 3 is the same as that of FIG. 2 and descriptions thereof will be omitted for brevity. The semiconductor memory device comprises a redundant memory block RBLK and redundant sense amplification and input/output blocks 14 and 15. The redundant sense amplification and input/output block 14 disposed at a top of the memory block RBLK selectively connects a part of redundant columns of the redundant memory block to redundant input/output lines RIO0 and RIO1, in response to a redundancy column selection signal RCSLj. Likewise, the redundant sense amplification and input/output block 15 disposed at a bottom of the memory block RBLK selectively connects the rest of the redundant columns to redundant input/output lines RIO2 and RIO3, in response to the redundancy column selection signal RCSLj. That is, when currently inputted column address information includes an address of a defective cell, one redundant column selection signal RCSLj is activated. Consequently, four columns are replaced at one time.

When any row is selected, input/output lines IO0–IO7 of the memory block BLK are respectively coupled to selectors SEL0–SEL7. At this time, signals of redundant input/output lines RIO0–RIO3 are respectively supplied to a first group of selectors SEL0–SEL3 and simultaneously to a second group of selectors SEL5–SEL8. In the case that the column address information includes defective information, the first or second group of selectors select the redundant input/output lines rather than the input/output lines of the memory block. For example, when defective cells are connected to the input/output lines IO0–IO3 related to the column selection signal CSLjL, the first group of selectors SEL0–SEL3 select the redundant input/output lines RIO0–RIO3 rather than the input/output lines IO0–IO3. Alternatively, when defective cells are connected to the input/output lines IO4–IO7 related to the column selection signal CSLjR, the second group of selectors SEL4–SEL7 select the redundant input/output lines RIO0–RIO3 rather than the input/output lines IO4–IO7. The foregoing repairing method is normally called a "data line redundancy."

A problem of the semiconductor memory device with the foregoing data line redundancy scheme is that when columns activated by each of the column selection signals CSLjR and CSLjL include defective data bit(s), the semiconductor memory device cannot perform a repair operation. This is because the redundancy input/output lines RIO0–RIO3 are shared by the selectors of each group. Only the input/output lines IO0–IO3 or IO4–IO7, which are selected by one of the simultaneously activated column selection signals CSLjR and CSLjL, may be replaced by the redundancy input/output lines RIO0–RIO3 via the first or second group of selectors SEL0–SEL3 or SEL4–SEL7.

SUMMARY OF THE INVENTION

In the semiconductor memory device according to the present invention a programmable address change circuit is provided. The address change circuit is programmable to change the column address used in addressing columns of the memory array in the semiconductor memory device.

For example, if the memory array includes two regions and the columns addressed in each region by the column address include defective cells, then the address change circuit can be programmed to change the column address such that columns actually addressed do not include defective cells. This is particularly useful where only the columns from one of the regions can be replaced with redundant columns. Accordingly, the present invention prevents a read failure that occurs when data from defective cells is output.

BRIEF DESCRIPTION OF THE DRAWINGS

FIG. 8 is a diagram illustrating memory blocks in one bank and an input/output line scheme related to the memory blocks according to an exemplary embodiment of the present invention;

FIG. 9A illustrates a portion of one exemplary embodiment of the address change circuit for use with the embodiment of FIG. 8;

DESCRIPTION OF THE PREFERRED EMBODIMENT

The present invention will now be more fully described hereinafter with reference to the accompanying drawings, in which preferred embodiments of the invention are shown.

Figure 1:
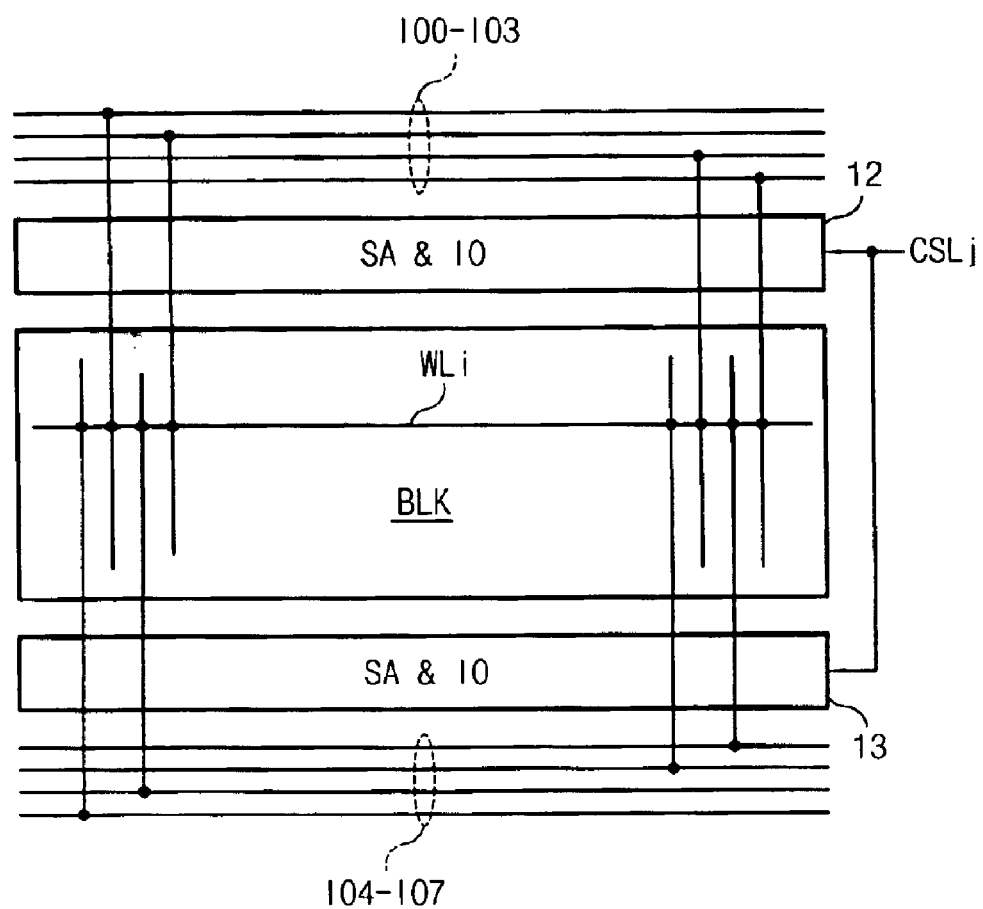
FIGS. 1 and 2 are diagrams illustrating prior art input/output line scheme.
Figure 2:
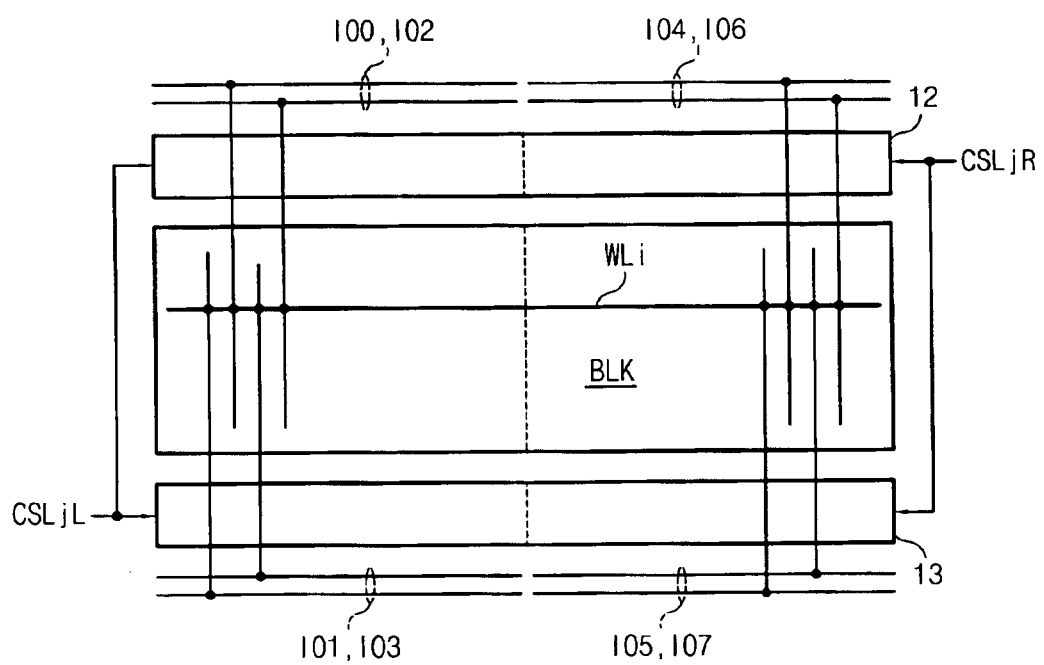
Figure 3:
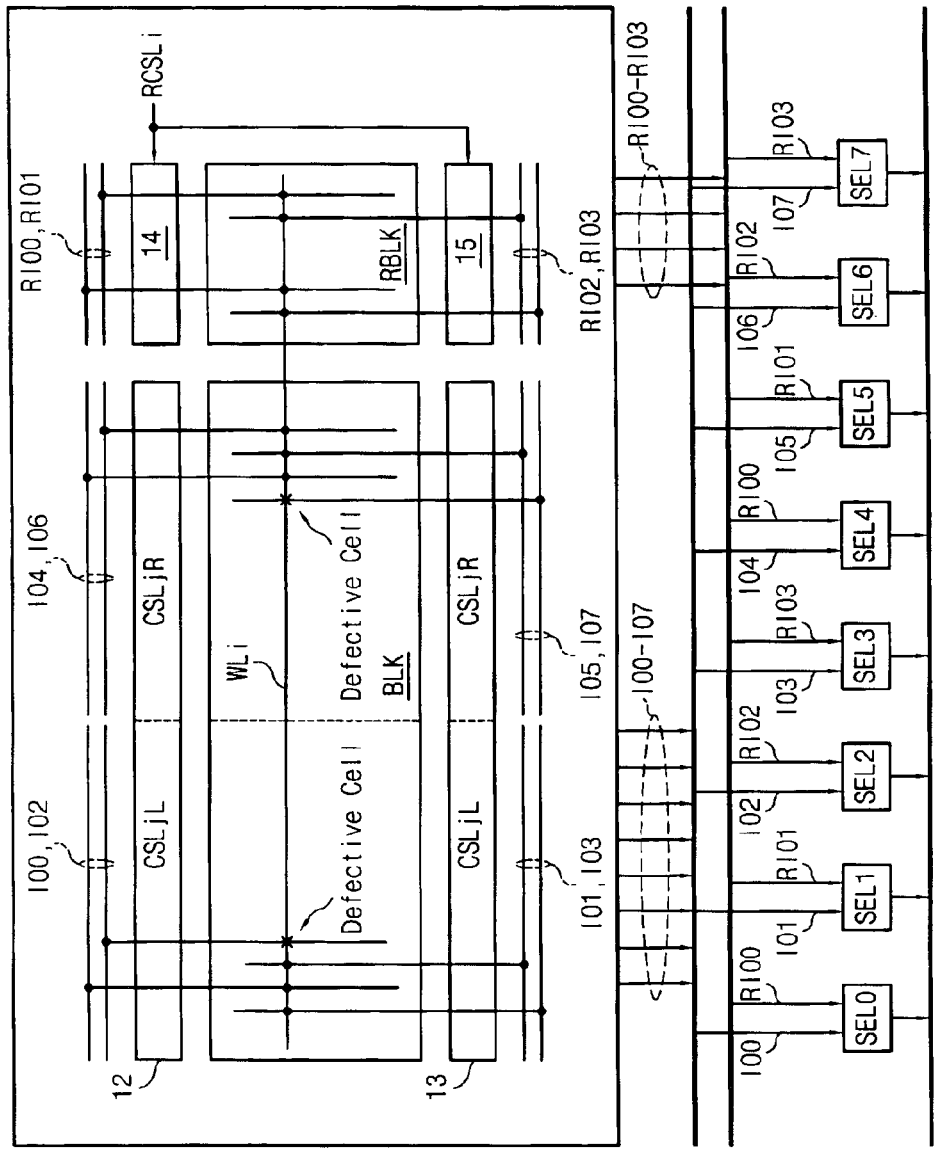
FIG. 3 is a block diagram illustrating a prior art semiconductor memory device.
Figure 4:
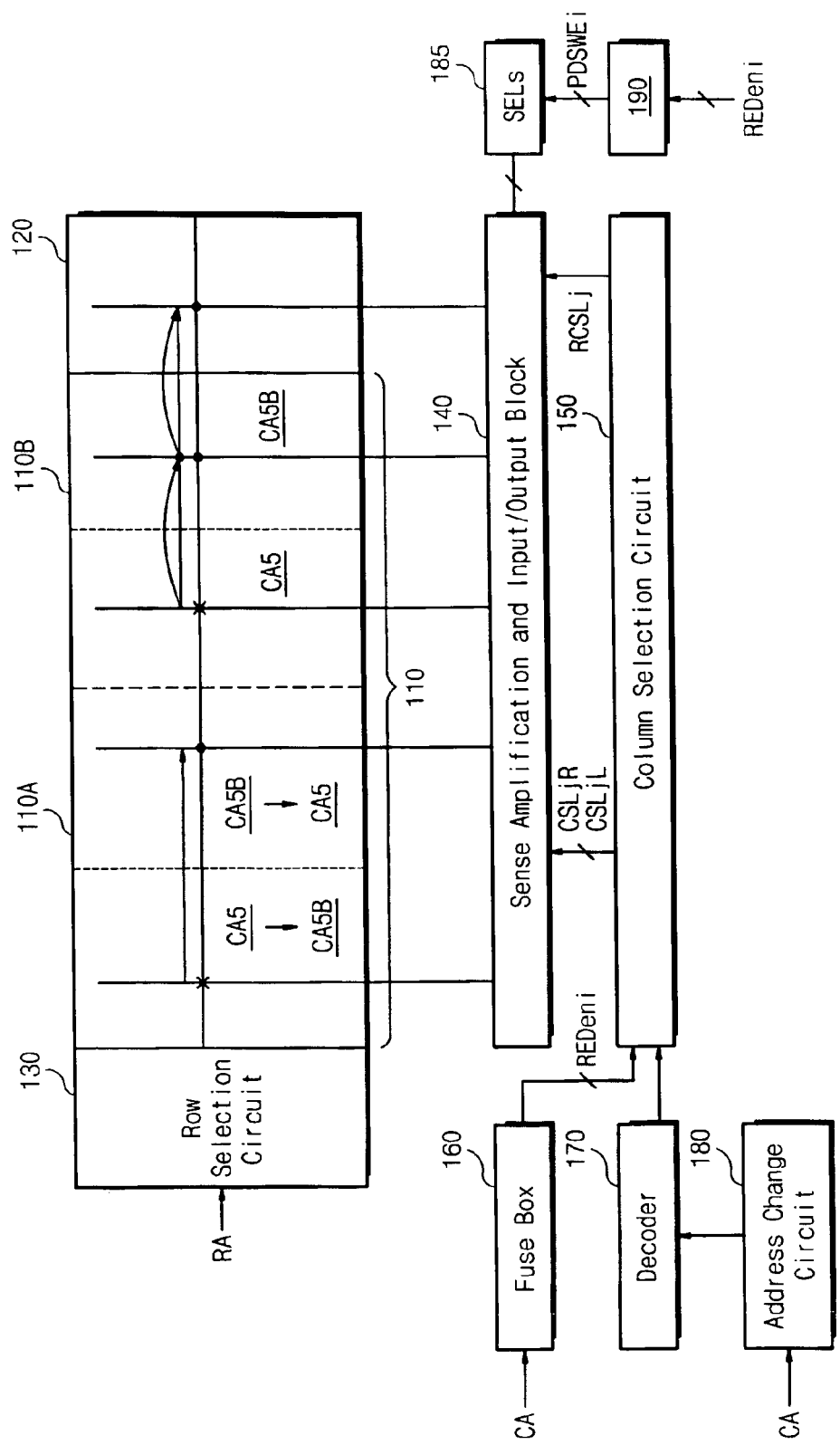
FIG. 4 is a block diagram illustrating a semiconductor memory device according to an exemplary embodiment of the present invention.

FIG. 4 is a block diagram illustrating a semiconductor memory device according to an exemplary embodiment of the present invention. Referring to FIG. 4, the semiconductor memory device includes a memory cell array, which is configured with a main cell array 110 and a redundant cell array 120. Although not shown in the drawings, each of the arrays 110 and 120 includes a plurality of memory cells which are arranged in a matrix of rows (or word lines) and columns (or bit lines). In the exemplary embodiment of the present invention shown in FIG. 4, the main cell array 110 is divided into first and second memory regions 110A and 110B. However, it would be apparent to those skilled in the art that the main cell array 110 may be divided into more memory regions.

A row selection circuit 130 selectively activates rows or word lines of the memory cell array, in response to a row address RA. An address change circuit 180 receives a column address and output the column address CA changed or unchanged based on its programming as will be described in detail below. A decoder 170 decodes the column address CA received from the address change circuit 180 and outputs the decoded address to a column selection circuit 150. The column selection circuit 150 generates column selection signals CSLjR and CSLjL based on the decoded column address. Main columns of the first memory region 110A are selected by the column selection signal CSLjL, and main columns of the second memory region 110B are selected by the column selection signal CSLjR. As described, when the column address CA is inputted, two column selection signals CSLjR and CSLjL are simultaneously activated. Main columns will be selected by each of the activated column selection signals CSLjR and CSLjL. For instance, when one column selection signal is activated, four main columns will be selected. That is, eight main columns will be selected by a column address CA. Furthermore, the column selection circuit 150 receives i redundancy enable signals REDeni generated by a fuse box 160, which is programmed to activate at least one of the i redundancy enable signals REDeni when the column address addresses a column of the memory array 110 including a defective cell. The column selection circuit 150 is programmed in the conventional manner to generate a redundant column selection signal RCSLj, which addresses a set of redundant columns in the redundant cell array 120, when a redundancy enable signal REDeni is activated.

The memory device also includes a sense amplification and input/output block 140, which includes sense amplification and column gate circuits corresponding to columns (referred to as "main columns") of the main cell array 110 and sense amplification and column gate circuits corresponding to columns (referred to as "redundant columns") of the redundant cell array 120. Each sense amplification and column gate circuit senses data of a memory cell in a column corresponding to the row selection signal and one of the column selection signals, and transfers the sensed data to a corresponding input/output line. An example of the sense amplification and column gate circuit is found in U.S. Pat. No. 6,278,650 entitled "Semiconductor Memory Device Capable of Keeping Sensing Efficiency of Data Line Sense Amplifier Uniform," which is hereby incorporated by reference in its entirety.

A selection circuit 185 selectively outputs the sensed data on the main and redundant input/output lines based on i control signals PDSWEi received from a programmable control circuit 190. As will be described in greater detail below, the control circuit 190 is programmed to control the selection performed by the selection circuit 185 based on the redundancy enable signals REDeni.

As alluded to above, the address change circuit 180 and the fuse box 160 are programmable circuits. As will be described in greater detail below, the address change circuit 180 is programmed to change the column address when at least one of the main columns addressed by both the column selection signals CSLjR and CSLjL include a defective cell. The fuse box 160 is a programmable circuit, as described in detail below, that is programmed with the addresses of defective columns. When the fuse box 160 receives a column address that includes a defective column, which is a column including one or more defective memory cells, the fuse box 160 activates a particular ith redundancy enable signal REDeni. The number i of redundancy enable signals depends on the number of regions into which the memory array 110 has been divided. In the exemplary embodiment of FIG. 4, the memory array 110 includes two regions 110A and 110B; therefore, first and second redundant enable signals REDen0 and REDen1 are generated depending on whether the column address addresses defective columns in the regions 110A and 110B.

An exemplary embodiment of the present invention will now be described in greater detail with respect to FIGS. 4–6.

Figure 5A:
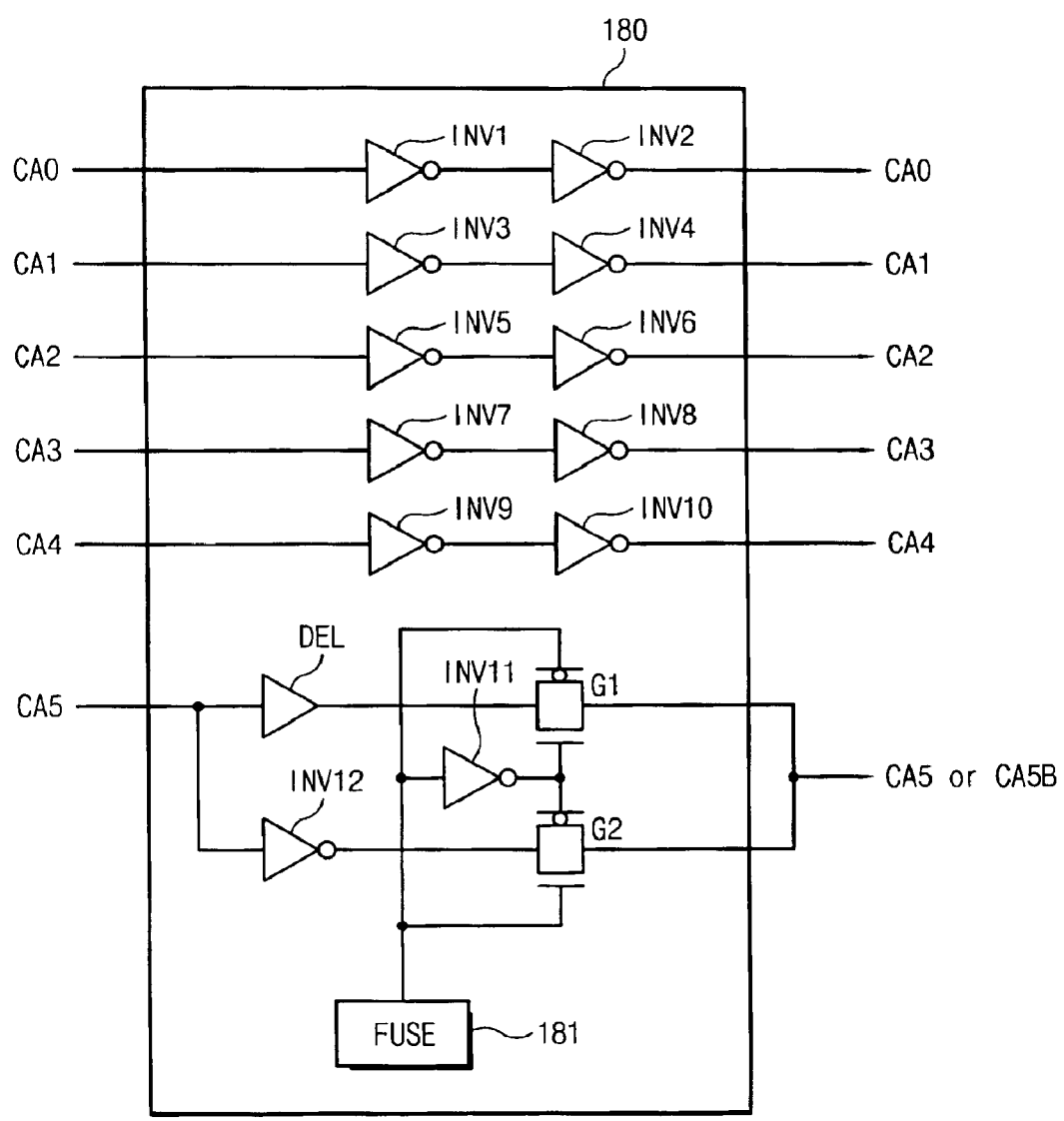
FIG. 5A illustrates an exemplary embodiment of the address change circuit of FIG. 4.

FIG. 5A illustrates an exemplary embodiment of the address change circuit 180 for when each memory region comprises 256 main columns. As shown in FIG. 5A, column address bit signals CA0–CA4 are outputted without change after being delayed by passing through a corresponding pair of inverter INV-1-INV-2, INV-3-INV-4, INV-5-INV-6, INV-7-INV-8 and INV-9-INV-10, the sixth column address bit signal CA5, however, is changed or output without change according to the state of a fuse in a fuse circuit 181. A pair of transmission gates G1 and G2 receive the sixth column address bit signal CA5. The first transmission gate G1 receives the sixth column address bit signal CA5 via a delay DEL and the second transmission gate receives an inverse of the sixth column address bit signal CA5B via an inverter INV12. Each transmission gate G1 and G2 is formed by a NMOS and PMOS transistor connected in parallel. The PMOS gate of the first transmission gate G1 and the NMOS gate of the second transmission gate G2 are connected to the fuse circuit 181. The NMOS gate of the first transmission gate and the PMOS gate of the second transmission gate G2 are connected to the fuse circuit 181 by an inverter INV11. The outputs of the first and second transmission gates G1 and G2 are connected together to form the output node for the sixth column address bit signal. The fuse circuit 181 includes a fuse arrangement such that when a fuse of the fuse circuit 181 is cut, the first and second transmission gates G1 and G2 are connected to a low voltage via the fuse circuit 181; and when the fuse is intact, the first and second transmission gates G1 and G2 are connected to a high voltage. According, when the fuse is cut, the sixth column address bit signal CA5 is output unchanged, but when the fuse is intact, the inverse of the sixth column address bit signal CA5B is output. In an exemplary embodiment of the present invention, the fuse is left intact when a column address would address defective columns in both regions of the memory array 110. It will be further appreciated, that the a more complex fuse circuit 181, which includes more fuses and receives one or more of the column address bit signals as inputs similar to the sub fuse box 161 described in detail below, would offer even greater selectivity in the address change operation. It will also be appreciated that by switching the delay DEL and the inverter INV12 in FIG. 5A, the inverse sixth address bit signal CA5B could be output by cutting the fuse 1930, and the sixth address bit signal could be output by leaving the fuse 1930 intact.

Figure 5B:
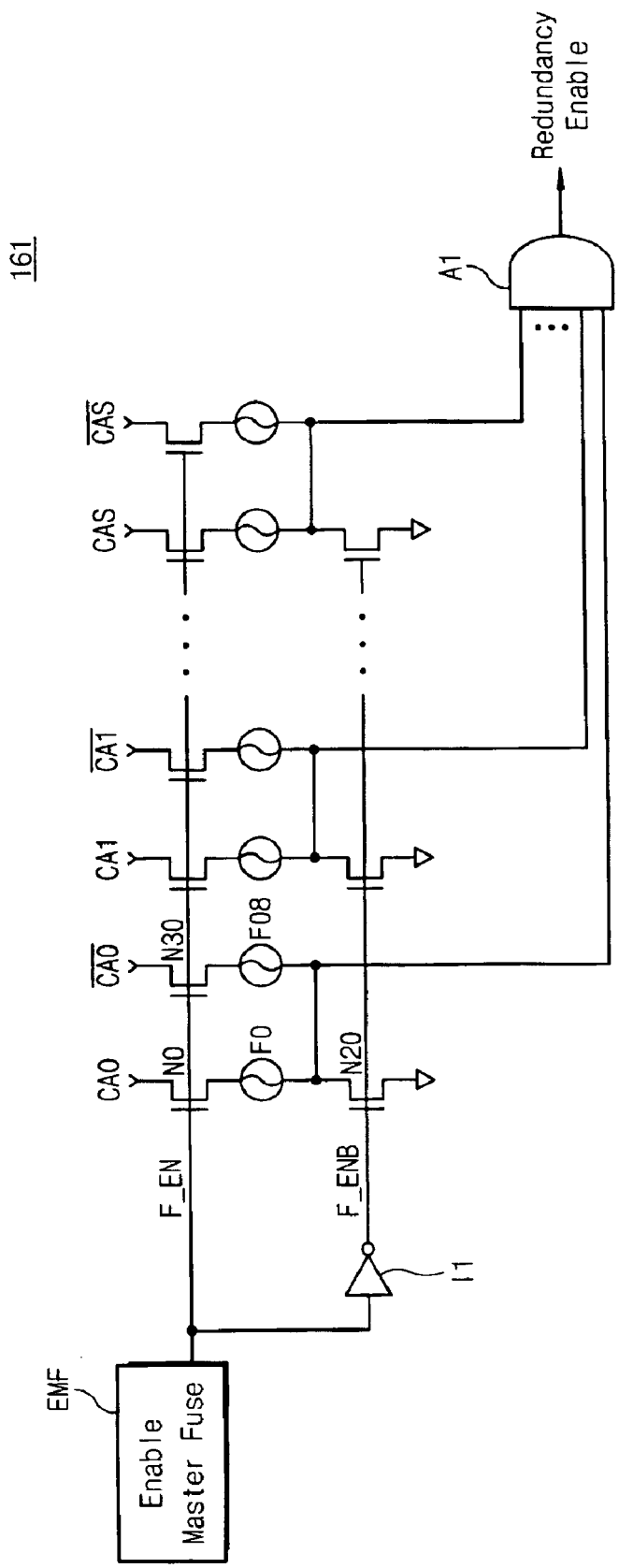
FIG. 5B illustrates an exemplary embodiment of a sub fuse box in the fuse box of FIG. 4.
Figure 5C:
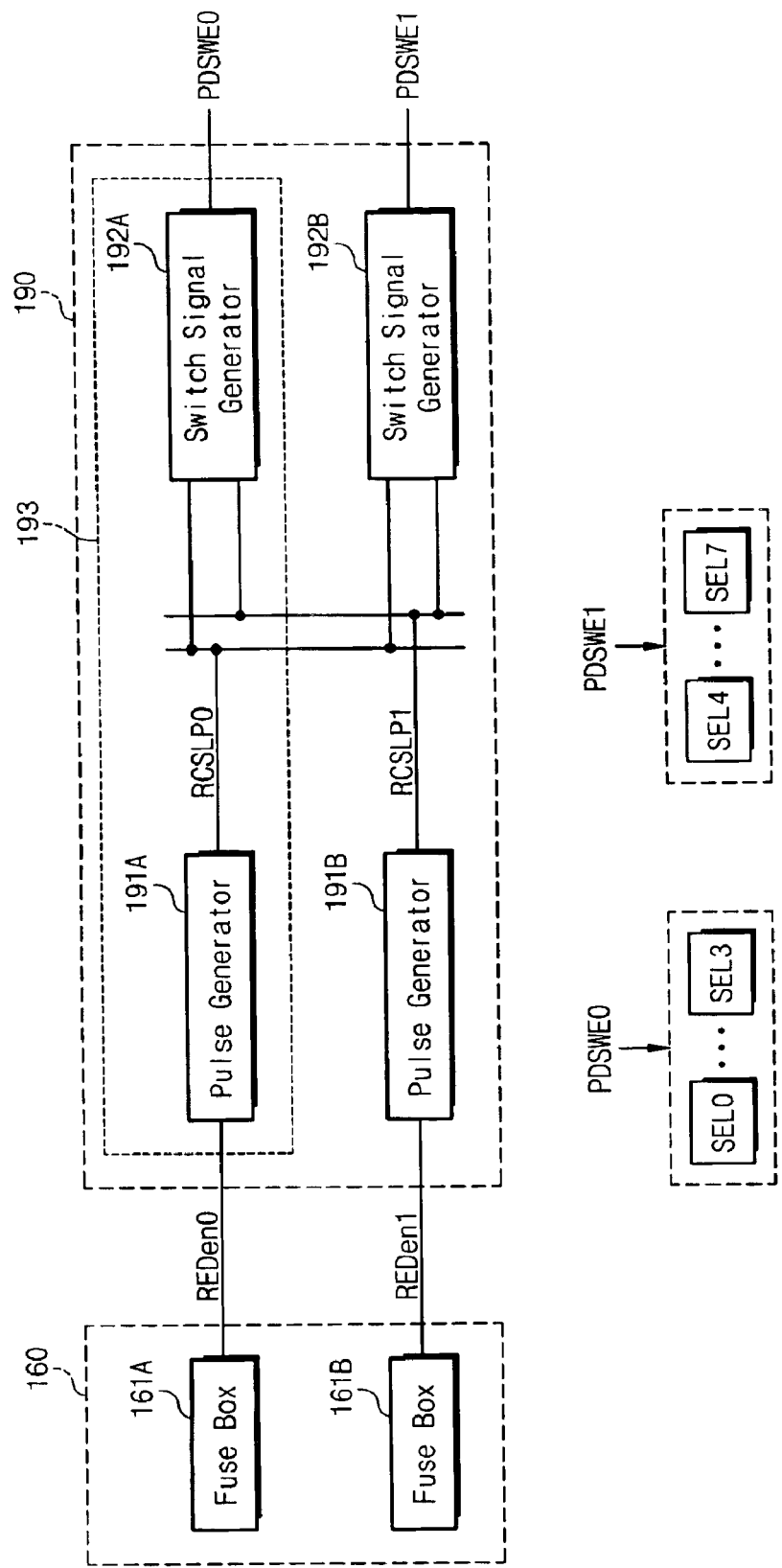
FIG. 5C illustrates an exemplary embodiment of the control circuit of FIG. 4.
Figure 5D:
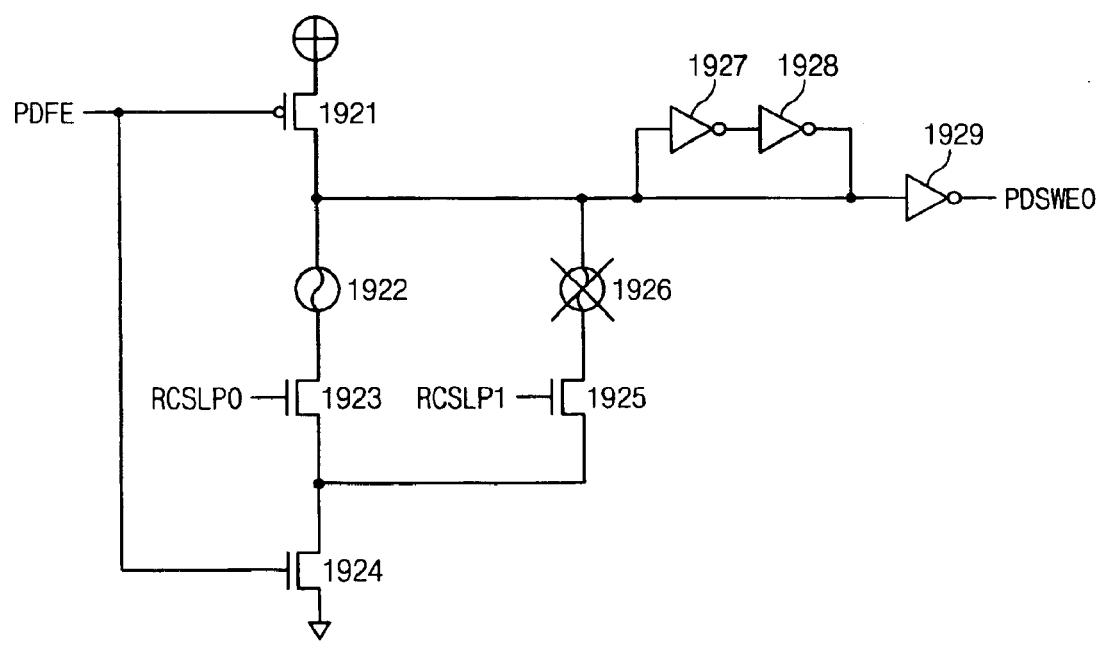
FIG. 5D illustrates an exemplary embodiment of the switch signal generator of FIG. 5C.
Figure 5E:
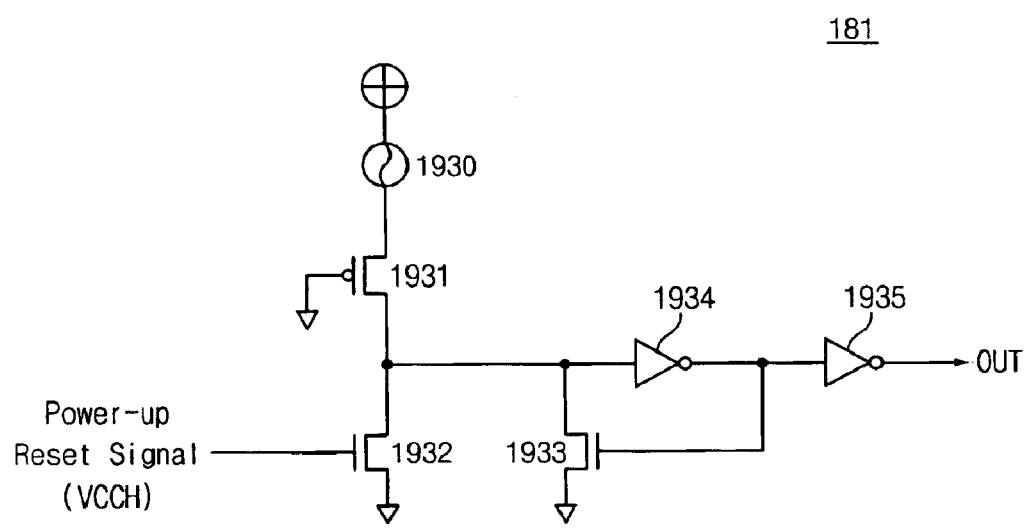
FIG. 5E illustrates an exemplary embodiment of the fuse circuit illustrated in FIG. 5A.

FIG. 5E illustrates one exemplary embodiment of a fuse circuit 181 according to the present invention. As shown, a fuse 1930 is connected in series with a PMOS transistor 1931 and an NMOS transistor 1932 between a power supply and ground. The PMOS transistor 1931 has its gate connected to ground, and the NMOS transistor 1932 receives a power-up reset signal at its gate. Two inverters 1934 and 1935 are connected in series between the output of the fuse circuit 181 and the common node between the PMOS transistor 1931 and the NMOS transistor 1932. And, an NMOS transistor 1933 is connected between the input of the inverter 1934 and ground, and has its gate connected to the input of the inverter 1935. As will be appreciated, when the fuse 1930 is intact, the fuse circuit 181 outputs a high voltage and when the fuse 1930 is cut, the fuse circuit 181 outputs a low voltage.

In the event that each of the memory regions 110A and 110B comprises 256 main columns and one column selection signal selects four main columns, 6-bit column address will be necessary to select main columns of each memory region. For example, each of the first and second memory regions 110A and 110B may be divided into regions "CA5" and "CA5B." If one of the main columns of the first memory region 110A corresponding to the column selection signal CSLjL is a defective column and one of the main columns of the second memory region 110B corresponding to the column selection signal CSLjR is a defective column, as illustrated in FIG. 4, the column address CA will be changed via the address change circuit 180 such that the regions "CA5" and "CA5B" of the first and memory regions 110A and 110B being addressed are changed. When defective columns (denoted by "×" in the drawing) of either or both of the first and second memory regions 110A and 110B are simultaneously addressed by the original and column address, the column address for the first and second memory regions 110A and 110B is changed via the address change circuit 180. Accordingly, as illustrated in FIG. 4, when the column address is inputted, other main columns are selected rather than the defective column of the first memory region 110A and the defective column of the second memory region 110B. Furthermore, as described in detail below, one of the columns addressed in the first memory region 110A and the second memory region 110B are replaced with the redundant columns addressed by the column selection circuit 150. FIG. 4 illustrates the main columns of the second memory region 110B being replaced.

As described above, the fuse box 160 generates one or more redundant enable signals REDen. Each redundant enable signal REDen is generated by a respective sub fuse box in the fuse box 160. FIG. 5B illustrates an exemplary embodiment of a sub fuse box 161 in the fuse box 160. The embodiment of FIG. 5B assumes a six-bit column address (i.e., each memory region includes 256 main columns), but it will be appreciated that the present invention is not limited to a six bit column address. As shown, an enable master fuse EMF generates an enable signal F_EN in the well-known manner. The enable signal is inverted by an inverter I1 to generate an inverted enable signal F_ENB. The first, least significant column address bit signal CA0 is received by a first NMOS transistor N0. The first NMOS transistor N0 is connected in series with a fuse F0 and a second NMOS transistor N2O. The second NMOS transistor N2O is connected to ground. The first NMOS transistor N0 and the second NMOS transistor N2O receive the fuse enable and inverse fuse enable signals at their gates. The second-sixth column address bit signals CA1–CA5 are received by the same structure as the first column address bit signal CA0. The inverse of the first column address bit signal CA0B is received by a third NMOS transistor N30, which receives the fuse enable signal at its gate. A fuse FB0 has one end connected to the third NMOS transistor N30 and the other end connected to the (i) a common node of the fuse F0 and the second NMOS transistor N20 and (ii) an input to an AND gate A1. The inverse of the second—sixth column address bit signals CA1B–CA5B are connected to identical structures as the inverse first column address bit signal CA0.

The fuses F0 and FB0 are blown in the conventional manner to program column addresses that address defective main columns. Namely, the fuses F0 and FB0 are blown such that a column address CA addressing at least one defective main column, will cause the AND gate A1 to generate a logic high (i.e., activated) redundancy enable signal REDen.

FIG. 5C illustrates the control circuit 190 in greater detail. As shown, the control circuit 190 includes a control signal generating circuit 193 associated with each region of the memory array 110. Each respective control generating circuit 193 receives the corresponding redundant enable-signal REDen from the associated sub fuse box 161 of the fuse box 160. For the purposes of clarity the elements in FIG. 5C corresponding to the region 110A of the memory array have the suffix A, and the elements in FIG. 5C corresponding to the region 110B of the memory array have the suffix B. Each control signal generating circuit 193 includes a pulse generator 191 generating a pulse RCSLP, in the well-known manner, in response to a corresponding, activated redundancy enable signal. A switch signal generator 192 generates a control signal PDSWE based on the received pulse, a timing signal, and internal programming.

FIG. 5D illustrates an exemplary embodiment of a switch signal generator 192. As shown, a column cycle timing signal PDFE periodically turns on a PMOS transistor 1921 such that a supply voltage is provided to fuses 1922 and 1926. The fuse 1922 is connected in series with an NMOS transistor 1923, and the fuse 1926 is connected in series with the NMOS transistor 1925. The NMOS transistors 1923 and 1925 receive the first and second pulse signals RCSLP0 and RCSPL1 corresponding to the first and second redundancy enable signals REDen0 and REDen1 at their gates. As will be appreciated a fuse and NMOS transistor arrangement is provided in association with each redundancy enable signal.

A NMOS transistor 1924 connects the NMOS transistors 1923 and 1925 to ground, and has its gate connected to the timing signal PDFE. A pair of inverters 1927 and 1928, serving as a delay are connected to the fuses 1922 and 1926 along with an output inverter 1929, which generates the control signal PDSWE.

By selectively cutting the fuses 1922 and 1926 in the switch signal generators 192, the switch signal generators 192 are programmed to output a control signal of a desired state depending on the received redundancy enable signals REDeni. For example, cutting fuse 1926 as shown in FIG. 5D results in the control signal PDSWE being activated when the first redundancy enable signal REDen0 is activated. Alternatively, cutting the fuse 1923 results in the control signal PDSWE being activated when the second redundancy enable signal REDen1 is activated. Or, cutting both fuses 1923 and 1926 prevents the control signal PDSWE from being activated regardless of whether the redundancy enable signals REDeni are activated. The affect of programming the switch signal generators 192 will now be described in detail below with respect to FIG. 6.

Figure 6:
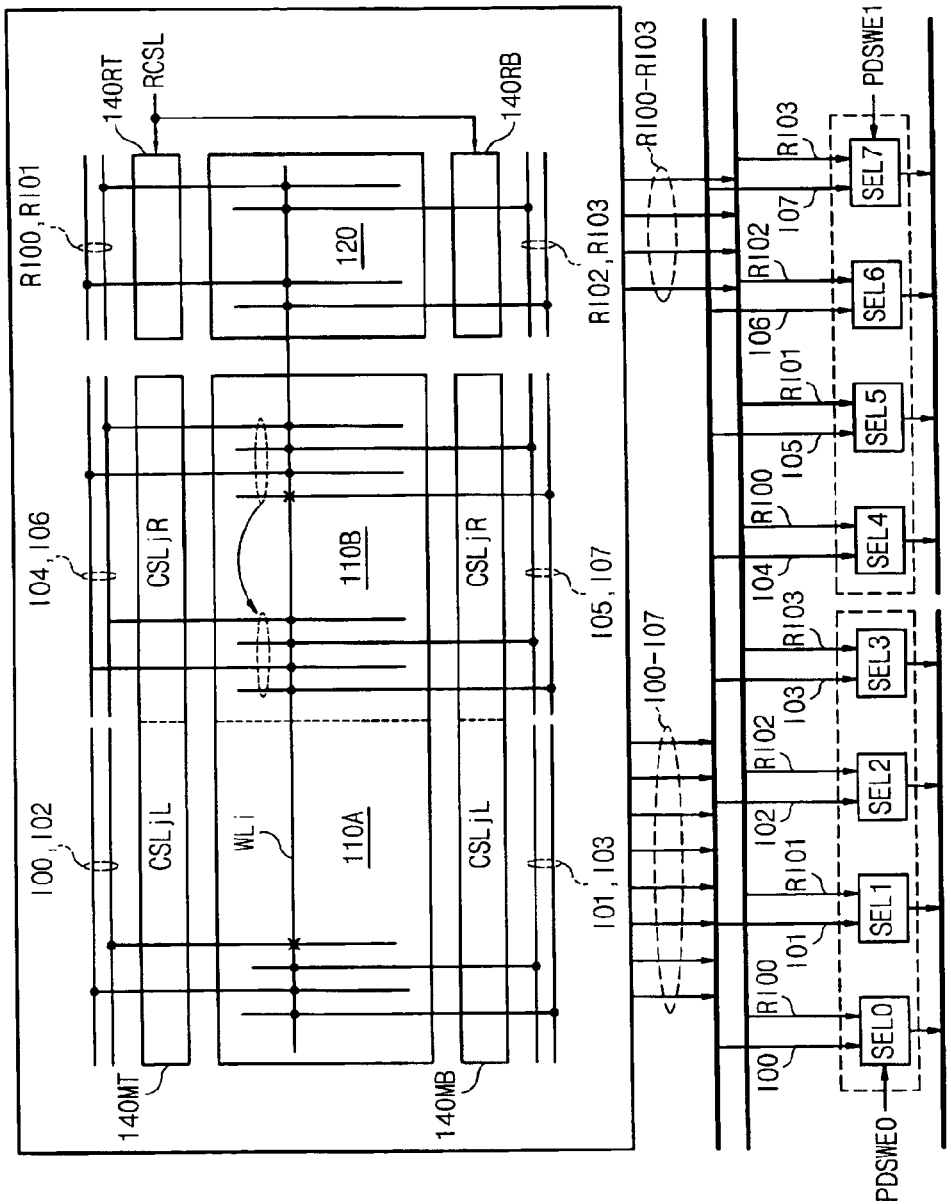
FIG. 6 is a block diagram illustrating an exemplary embodiment of an input/output line scheme of a memory cell array in FIG. 4.

FIG. 6 is a block diagram illustrating an input/output line scheme of the memory cell array of FIG. 4. Referring to FIG. 6, four input/output lines IO0, IO2, IO4, and IO6 are disposed at a top of the main cell array 110, and four input/output lines IO1, IO3, IO5, and IO7 are disposed at a bottom of the main cell array 110. Two input/output lines IO0 and IO2 of the input/output lines disposed at the top are disposed at a top of the first memory region 110A, and the other input/output lines IO4 and IO6 of the top input/output lines are disposed at a top of the second memory region 110B. Likewise, two input/output lines IO1 and IO3 of the input/output lines disposed at the bottom are disposed at a bottom of the first memory region 110A, and the other input/output lines IO5 and IO7 of the bottom input/output lines are disposed at a bottom of the second memory region 110B. In the input/output line scheme, the input/output lines IO0–IO3 are selectively coupled to main columns of the first memory region 110A via sense amplification and input/output blocks 140MT and 140MB, according to the column selection signal CSLjL. The input/output lines IO4–IO7 are selectively coupled to main columns of the second memory region 110B via the sense amplification and input/output blocks 140MT and 140MB, according to the column selection signal CSLjR. Here, the column selection signals CSLjR and CSLjL are activated by the identical column address information.

As further shown in FIG. 6, a redundant sense amplification and input/output block 140RT disposed at a top of the redundant cell array 120 selectively connects a part of the redundant columns of the redundant cell array 120 to the redundant input/output lines RIO0 and RIO1, in response to a redundancy column selection signal RCSLj generated by the column selection circuit 150. Similarly, a redundant sense amplification and input/output block 140RB disposed at a bottom of the redundant cell array 120 selectively connects the other redundant columns to redundant input/output lines RIO2 and RIO3, in response to the redundancy column selection signal RCSLj. That is, when the currently inputted column address information includes the address of a main column including a defective memory cell, a redundant column selection signal RCSLj is activated by the column selection circuit 150. Because the structure and operation of the column selection circuit 150 is well-known, a detailed description thereof will not be provided for the sake of brevity.

The input/output lines IO0–IO7 of the main cell array 110 are respectively coupled to selectors SEL0–SEL7. The redundant input/output lines RIO0–RIO3 are supplied in common to a first group of selectors SEL0–SEL3 and a second group of selectors to SEL5–SEL8. In the event that one of the main columns selected in the first memory region 110A of the main cell array is a defective column and one of the main columns selected in the second memory region 110B of the memory cell array is a defective column, as mentioned above, the column address for selecting the main columns of the first and second memory regions 110A and 110B can be changed by programming the address change circuit 180 of FIG. 4. For example, as illustrated in FIG. 6, the column address of the second memory region 110B is changed to select other main columns than the main columns including defective column(s). The same is true for the first memory region 110A.

Furthermore, as shown in FIG. 6, the first control signal PDSWE0 controls the selection made by the selectors SEL0–SEL3 and the second control signal PDSWE1 controls the selection made by the selectors SEL4–SEL7. By programming the corresponding switch signal generators 192, either the selectors SEL0–SEL3 or the selectors SEL4–SEL7 can be controlled to output the data on the redundant input/output lines RIO0–RIO3. For example, if only one of the main columns addressed in the first memory region 110A includes a defective column, the switch signal generator 192A is programmed to activate the first control signal PDSWE0 when the first redundancy enable signal REDen0 is activated. This will cause the selectors SEL0–SEL3 to output the data on the redundant input/output lines RIO0–RIO3. Similarly, if only one of the main columns addressed in the second memory region 110B includes a defective column, the switch signal generator 192B is programmed to activate the second control signal PDSWE1 when the second redundancy enable signal REDen1 is activated. This will cause the selectors SEL4–SEL7 to output the data on the redundant input/output lines RIO0–RIO3. Or, if the main columns addressed in both the first and second regions 110A and 110B include a defective column, the switch signal generators 192A and 192B are selectively programmed so that only one of the first and second control signals is activated when the associated redundancy enable signal is activated.

Figure 7:
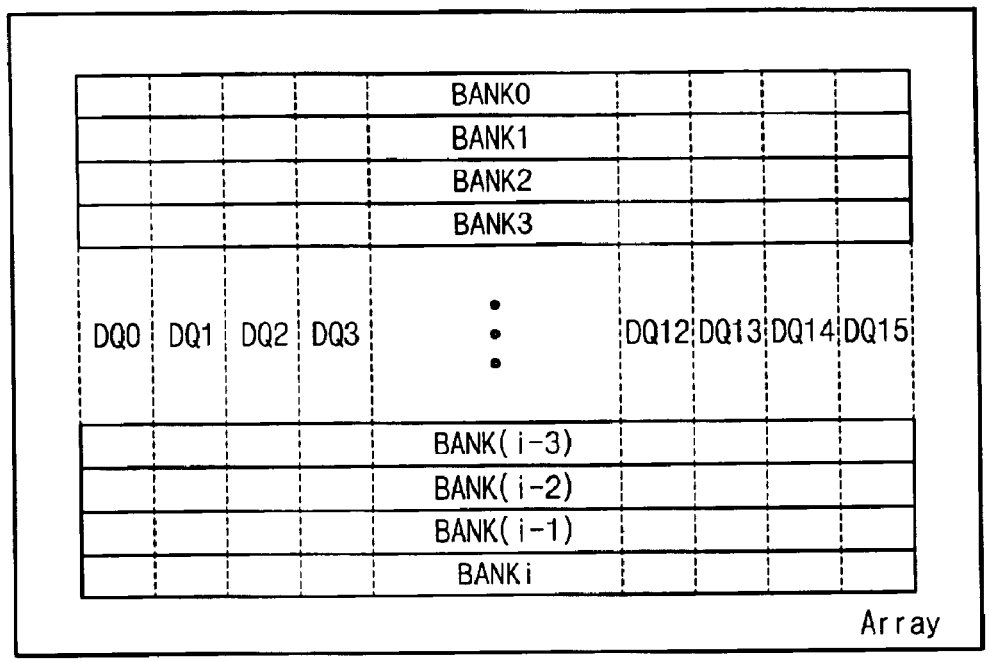
FIG. 7 is a diagram illustrating an embodiment of an array scheme of a RAMBUS DRAM device according to the present invention.

A semiconductor memory device, for example, a RAMBUS DRAM device comprises a memory cell array including a plurality of banks BANKi (Here, i=0–31). Each bank, as illustrated in FIG. 7, is divided into memory blocks DQj (Here, j=0–15) corresponding respectively to input/output pins of the device. Each of the memory blocks has an array scheme and an input/output line scheme as illustrated in FIG. 6 and adopts the identical redundancy method. In the case of the RAMBUS DRAM device, if one bank is selected, 8bit data, for example, will be respectively outputted from each memory block of the selected bank. A redundancy memory block for replacing a defective cell of the memory block is responsible for defects of 2 or more memory blocks.

For instance, in the case that the redundancy memory block is responsible for defects of 2 memory blocks and columns selected from each of the 2 memory blocks include a defective column, a repair operation may be performed according to the foregoing redundancy method. Detailed operation will be described hereinafter with respect to FIG. 8. Like numbers refer to like elements in FIGS. 6 and 8. In FIG. 8, only two memory blocks DQ0 and DQ1 are shown. The redundant memory block 120 has a capacity for replacing defective columns generated at two memory blocks DQ0 and DQ1, and the redundant input/output lines RIO0–RIO3 are shared by two memory blocks. When one bank is selected, as described above, 8-bit data is respectively read out from the memory blocks in the selected bank. That is, two column selection signals are simultaneously activated in each memory block. At this time, in the case that the defective column is selected in each memory block, the repair operation cannot be performed for both defective columns due to limitations of the redundant input/output lines. However, the column address of one memory block is changed to perform the repair operation. For example, while the defective column of the memory block DQ0 is replaced by the redundant column, the column address of the second memory region 110B of the memory block DQ1 will be changed.

FIG. 9A illustrates a portion of the address change circuit 180 and the column address decoding structure to accomplish this. As shown, each memory block DQ0 and DQ1 has an associated column decoder 170. The address change circuit 180 supplies the column address to each decoder 170 and includes independent address change circuitry 182 associated with each decoder 170. As schematically shown in FIG. 9, the independent address change circuitry has the same structure as FIG. 5A with a fuse circuit 181 controlling whether the sixth column address bit signal CA5 or its inverse CA5B is output to the respective decoder. In this manner, the address change circuit 180 can be programmed to selectively change the address for one memory block but not the other.

Figure 9B:
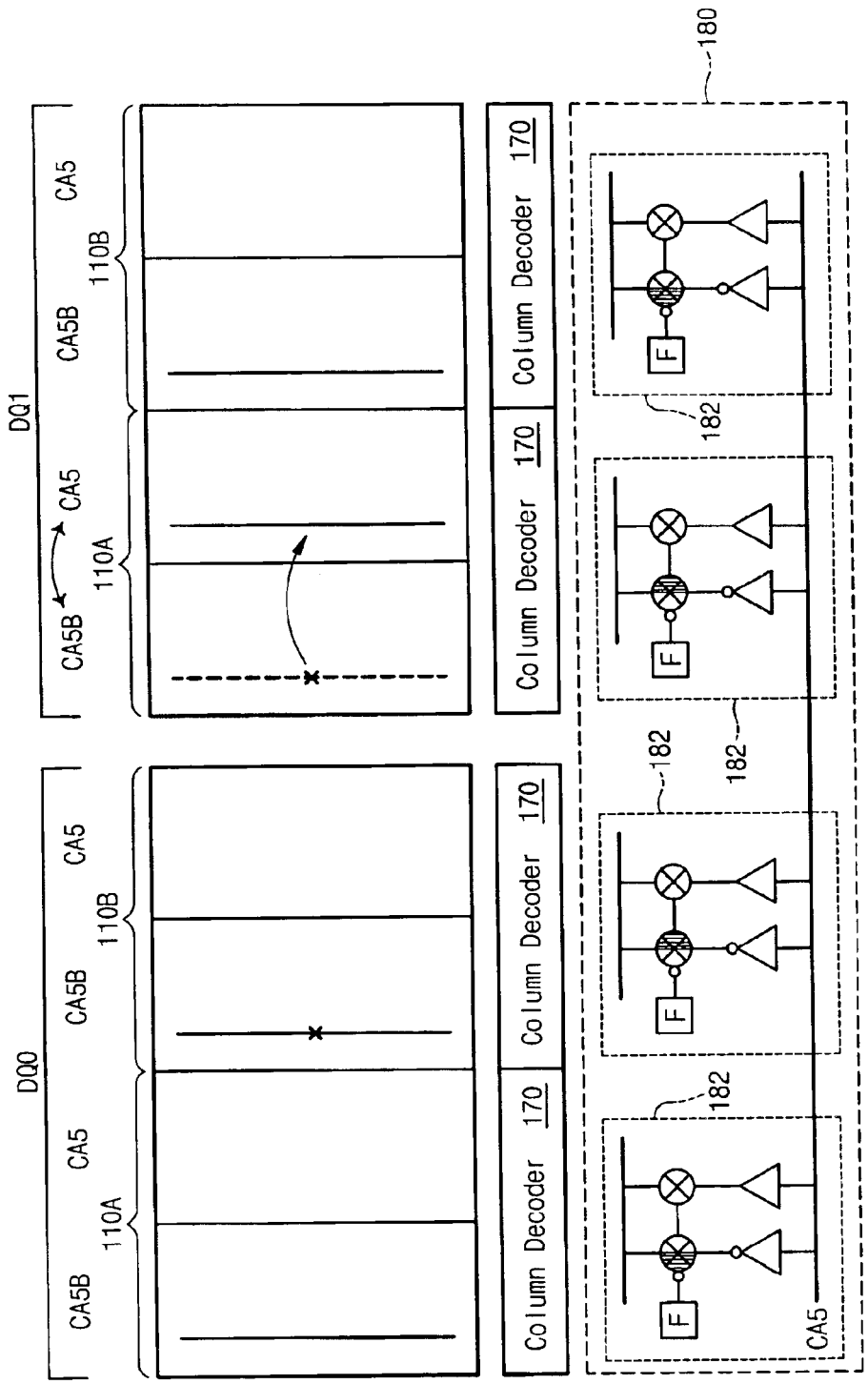
FIG. 9B illustrates a portion of another exemplary embodiment of the address change circuit for use with the embodiment of FIG. 8.

FIG. 9B illustrates a portion of the address change circuit 180 and the column address decoding structure according to another embodiment of the present invention. This embodiment allows selective control of address changes at a memory region level. As shown, each memory region 110A and 110B of each memory block DQ0 and DQ1 has an associated column decoder 170 and associated address change circuitry 182. As will be understood from the forgoing disclosure the address change circuit embodiment for selectively changing an address at the memory region level is also applicable to the embodiment of the present invention illustrated in FIG. 4.

Figure 9C:
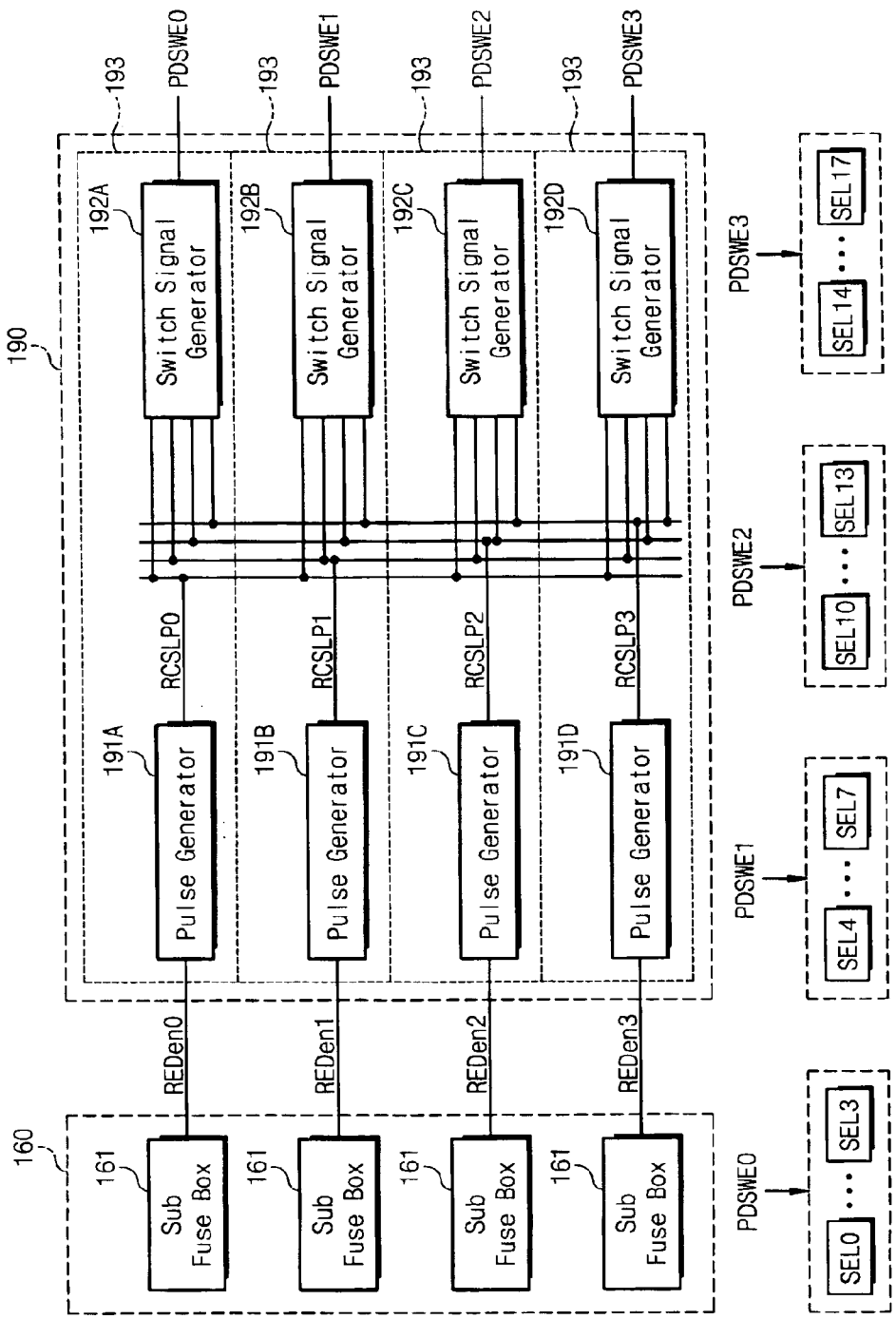
FIG. 9C illustrates an exemplary embodiment of the control circuit for use with the embodiment of FIG. 8.
Figure 9D:
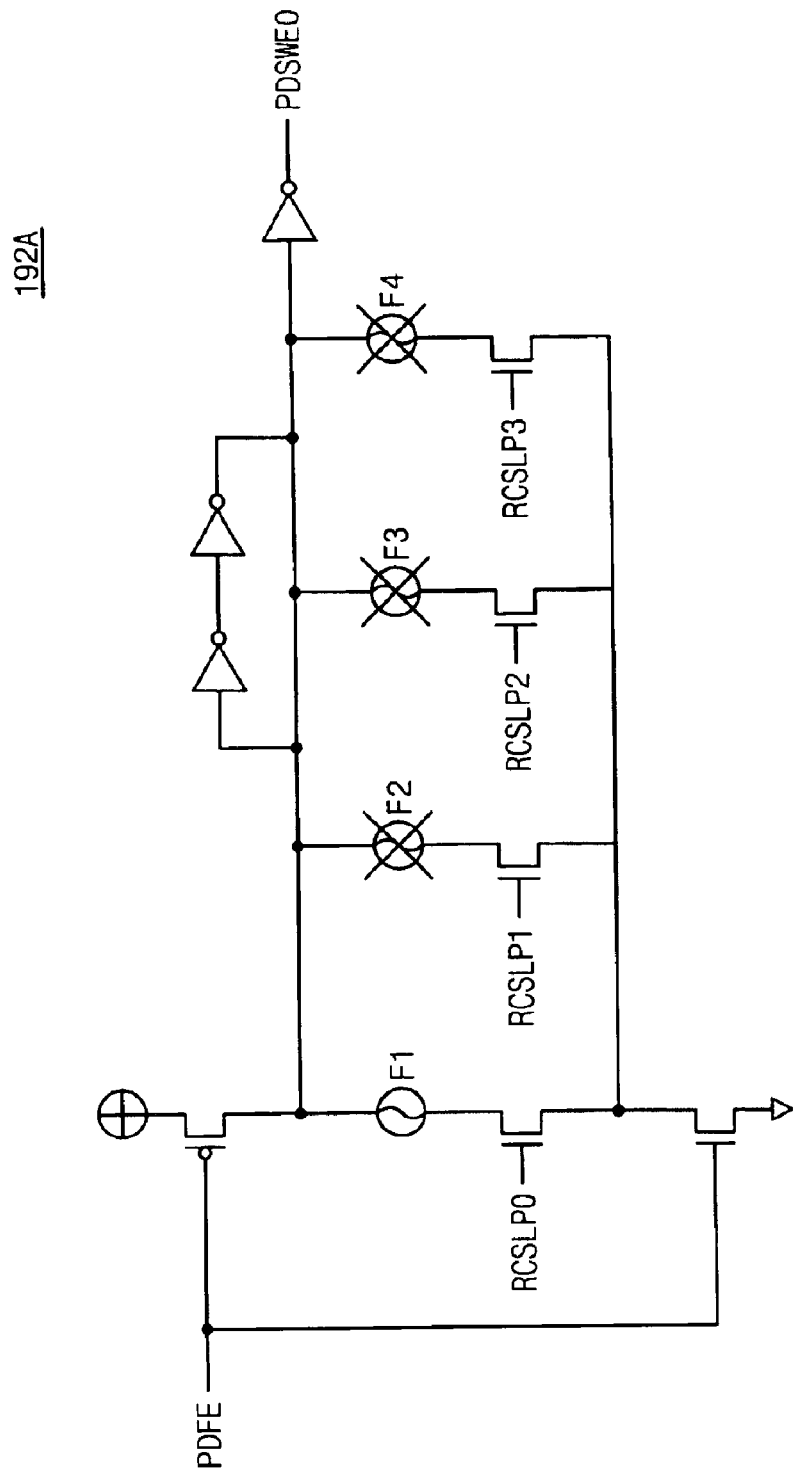
FIG. 9D illustrates an exemplary embodiment of the switch signal generator in FIG. 9C.

Returning to FIG. 8, the input/output lines IO0–IO7 of the memory block DQ0 are respectively coupled to selectors SEL00–SEL07, and the input/output lines IO0–IO7 of the memory block DQ1 are respectively coupled to corresponding selectors SEL10–SEL17. Likewise, the redundant input/output lines RIO0–RIO3 are supplied in common to each group of selectors SEL00–SEL03, SEL04–SEL07, SEL10–SEL13, and SEL14–SEL17. As compared to the embodiment of FIG. 4, the embodiment of FIG. 8 includes two additional memory regions associated with the same redundant cell array. Accordingly, as shown in FIG. 9C, the fuse box includes two additional sub fuse boxes 161 for generating third and fourth redundant enable signals REDen2 and REDen3 when the column address addresses main columns in the first and second memory arrays 110A and 110B, respectively, of the second memory block DQ1. Furthermore, the control circuit 190 includes third and fourth control signal generating circuits 193 generating third and fourth control signals PDSWE2 and PDSWE3 based on the third and fourth control signals and their programming. As shown in FIG. 9D, the switch signal generators 192 in the embodiment of FIG. 9C includes fuse and NMOS series circuit structures to account for the additional third and fourth pulse signals RCLSP2 and RCSLSP3 generated from the third and fourth redundancy enable signals REDen2 and REDed3. Because the operation of the circuits illustrated in FIGS. 9C and 9D are readily understood based on the detailed descriptions of the circuits illustrated in FIGS. 5C and 5D, a detailed operational description of the circuits illustrated in FIGS. 9C and 9D will not be provided for the sake of brevity.

As shown in FIGS. 8 and 9C, the first, second, third and fourth control signals PDSWE0–PDSWE3 control the selection made by the selectors SEL00–SEL03, SEL04–SEL07, SEL10–SEL13, and SEL14–SEL17, respectively, in relatively the same manner as discussed above with respect to the embodiment of FIG. 4.

Figure 10:
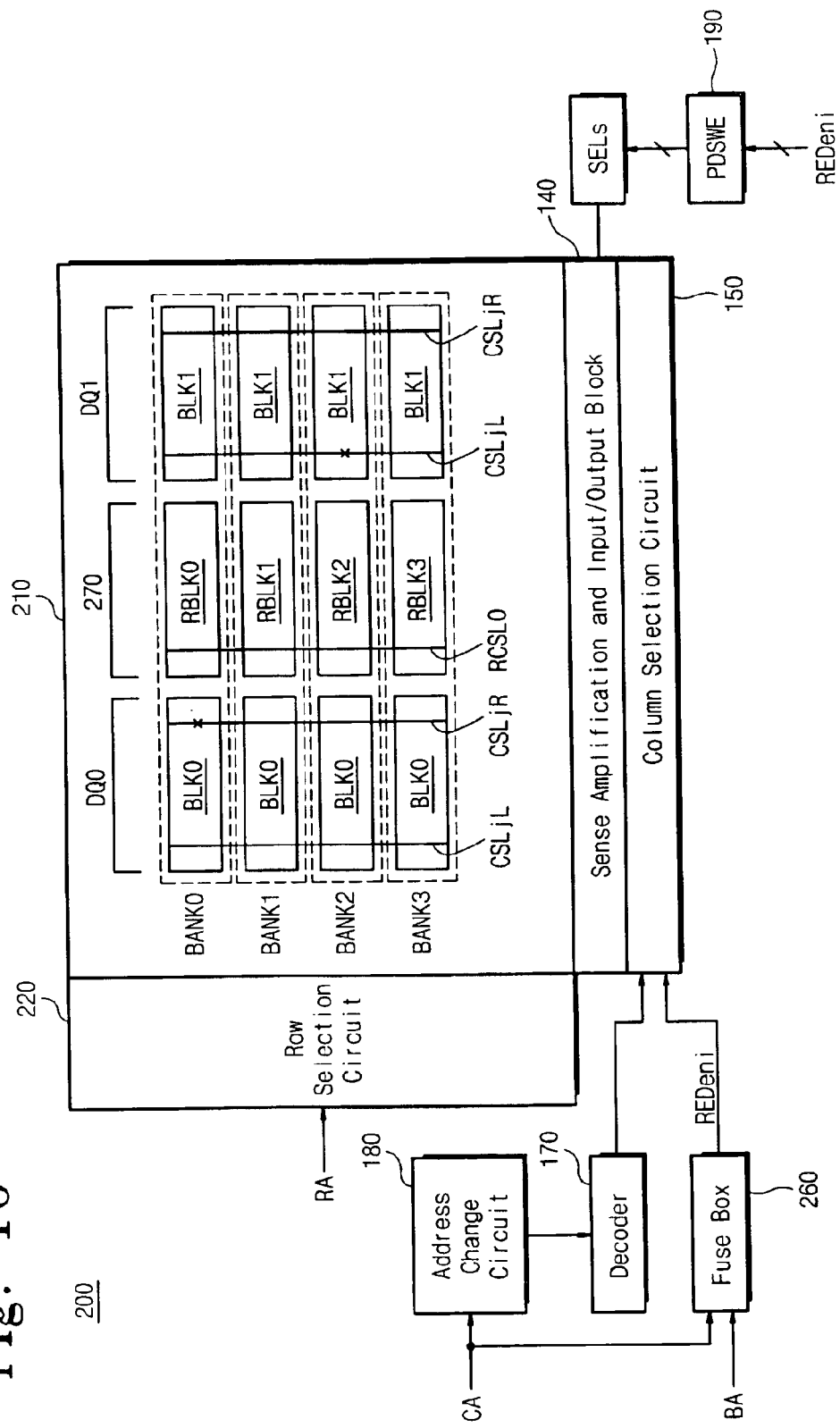
FIG. 10 is a block diagram illustrating a semiconductor memory device according to another exemplary embodiment of the present invention.

FIG. 10 illustrates a semiconductor memory device according to another embodiment of the present invention; wherein like reference numeral designate like components from FIG. 8 and 9C–9D. As shown, the column address CA is supplied to a decoder 170 which decodes the column address, and supplies the decoded column address to the column selection circuit 150. The column selection circuit 150 generates column selection signals CSLjL and CSLjR.

The memory cell array 210 of the semiconductor memory s device is configured with a plurality of banks BANKi (here, i=0–3). Each of the banks includes memory blocks corresponding to respective input/output pins. As a matter of convenience, FIG. 10 illustrates banks having memory blocks BLK0 and BLK1 corresponding to only two input/output pins. However, those skilled in the art will understand that the present invention is not limited to having only two memory blocks per memory bank. Each memory bank also includes a redundant memory block RBLK.

The column selection signals CSLjR and CSLjL are supplied to each memory block in each memory bank. Each column selection signal addresses four main columns in each memory block. A row selection circuit 220 receives a row address and activates a row or word line in each bank. The data addressed by the row selection circuit 220 and the column selection circuit 150 in each memory block is sensed and output by a sense amplification input/output block 140. For the purposes of illustration only, the sense amplification and input/output block 140 has been illustrated as a single block in FIG. 10. However, it should be understood that the memory bank structure and corresponding sense amplification and input/output block structure of FIG. 10 is the same as that illustrated in FIG. 8 wherein memory block BLK0 in FIG. 10 corresponds to memory block DQ0 in FIG. 8 and memory block BLK1 in FIG. 10 corresponds to memory block DQ1 in FIG. 8.

Figure 11:
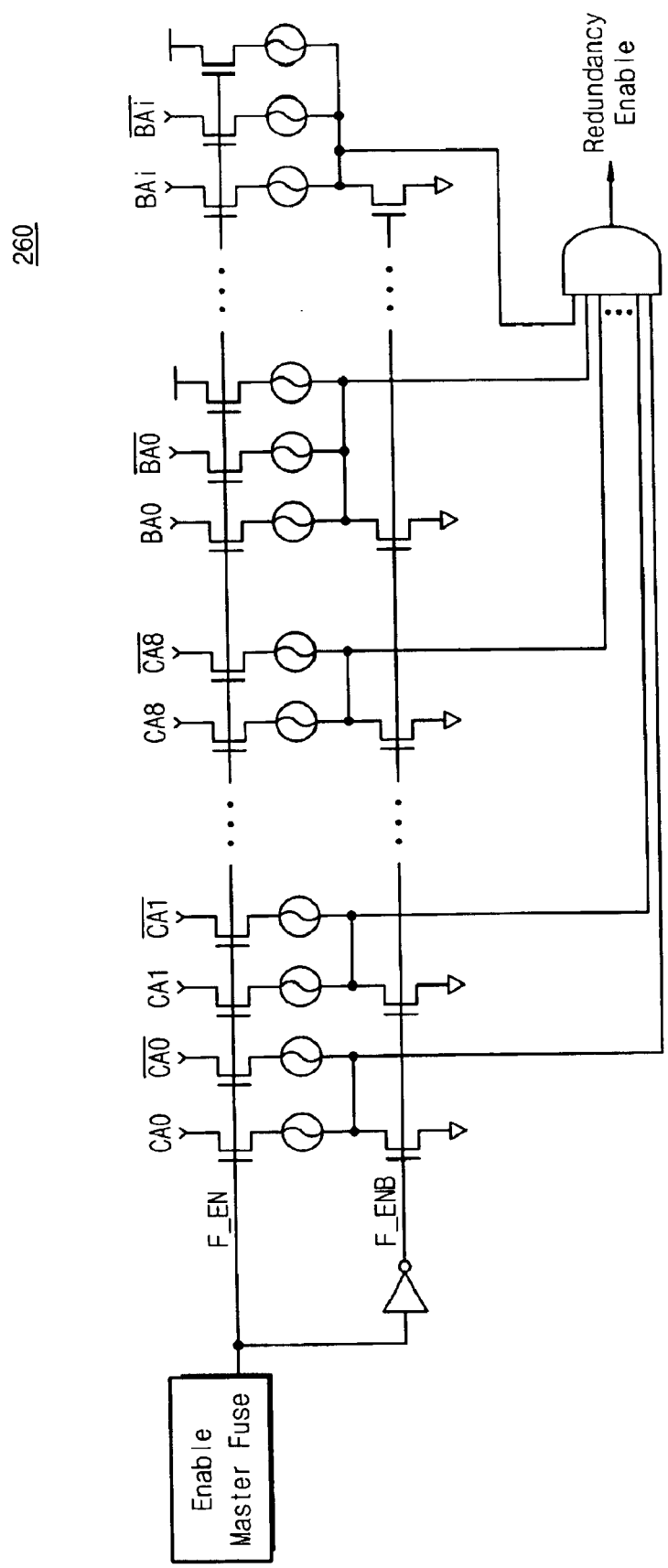
FIG. 11 illustrates an exemplary embodiment of a sub fuse box in the fuse box of FIG. 10.

The semiconductor memory device 200 in FIG. 10 also includes a fuse box 260 which receives both the column address and a bank address BA. The fuse box 260 has a sub fuse box structure as illustrated in FIG. 11 for generating each redundancy enable signal. This structure is the same as the fuse box 160 illustrated in FIG. 5B except that additional fuse structures for the possible bank addresses have been added. Namely, each bank address bit signal BA0–BA3 and inverse bank address bit signal is connected to a fuse circuit structure in the same manner as the column address bit signals CA0–CA5 and inverse column address bit signals in FIG. 5B. Accordingly, the fuse box 260 is programmed by blowing or cutting fuses such that defective main columns in different banks can be distinguished from one another even though they have the same column address. The column selection.

When the column selection circuit 150 receives the redundancy enable signal, the column selection circuit generates a redundant column selection signal RCSLj. Consequently, when, for example, the first redundant column selection signal RCSL0 is activated, four redundant columns are supplied by each redundant memory block RBLK to the selectors SEL00–SEL03, SEL04–SEL07, SEL10–SEL13 and SEL14–SEL17, associated with the memory bank including the respective redundant memory block RBLK. The selection process with respect to the control circuit 190 and the selectors is performed as described above with respect to FIGS. 8, 9C and 9D.

As set forth before, in a semiconductor memory device having a redundancy data line scheme, even if main columns selected by each of column selection signals of the identical column address include defective column(s), the column address can be changed so as to perform a repair operation. In addition, even when the identical columns of different memory banks suffer from defects, a redundant memory block is selectively activated according to a memory bank. As a result, it possible to reduce a fail probability of the identical column address.

While the present invention has been described in connection with description of the preferred embodiment and drawings thereof, it is capable of various changes and modifications without departing from the spirit and scope of the invention.

What is claimed is:

1. A semiconductor memory device having at least one main memory cell array and at least one redundant memory cell array, comprising:
   an address change circuit programmable to change a column address; and
   a column selection circuit receiving the column address from the address change circuit and generating first and second column selection signals addressing columns in separate first and second portions of the main memory cell array based on the received column address.

2. The semiconductor memory device of claim 1, further comprising:
   a redundancy enable signal generating circuit programmable to generate at least one redundancy enable signal when the column address addresses a column of the main memory cell array including a defective cell; and
   a selection circuit selectively replacing addressed columns from one of the first and second portions with redundant columns based on at least one control signal;
   a control circuit programmable to generate the control signal based on the redundant enable signal; and wherein
   the column selection circuit addresses the redundant columns based on redundant enable signal.

3. The semiconductor memory device of claim 1, wherein the first and second portions are first and second regions of the main memory cell array.

4. The semiconductor memory device of claim 1, wherein the first and second portions are first and second blocks of the main memory cell array.

5. A semiconductor memory device of claim 1, wherein the address change circuit is programmable to change the column address to prevent the column select circuit from generating the first and second column selection signals each addressing at least one defective column.

6. A method of configuring a semiconductor memory device having at least one main memory cell array and at least one redundant memory cell array, and including a column selection circuit that generates first and second column selection signals addressing columns in separate first and second portions of the main memory cell array based on a received column address, comprising:

programming an address change circuit to change the column address received by the column selection circuit.

7. The method of claim 6, further comprising:

programming a redundancy enable signal generating circuit to generate a redundancy enable signal when the column address addresses a column of the main memory cell array including a defective cell; and programming a control circuit to generate at least one control signal, which controls operation of a selection circuit in selectively replacing columns selected by the column selection circuit from one of the first and second portions with redundant columns selected by the column selection circuit, based on the redundant enable signal.

8. The method of claim 6, wherein the first and second portions are first and second regions of the main memory cell array.

9. The method of claim 6, wherein the first and second portions are first and second blocks of the main memory cell array.

10. The method of claim 6, wherein programming the address change circuit includes changing the column address to prevent the column select circuit from generating the first and second column selection signals each addressing at least one defective column.

* * * * *